United States Patent [19]
Lo et al.

[11] Patent Number: 5,993,575
[45] Date of Patent: *Nov. 30, 1999

[54] METHOD FOR FABRICATING RANDOMLY ORIENTED ALUMINUM ALLOY SPUTTERING TARGETS WITH FINE GRAINS AND FINE PRECIPITATES

[75] Inventors: Chi-Fung Lo, Fort Lee, N.J.; Darryl Draper, Congers, N.Y.

[73] Assignees: Sony Corporation, Tokyo, Japan; Materials Research Corporation, Orangeburg, N.Y.

[*] Notice: This patent is subject to a terminal disclaimer.

[21] Appl. No.: 09/054,146

[22] Filed: Apr. 2, 1998

Related U.S. Application Data

[62] Division of application No. 08/743,305, Nov. 5, 1996, Pat. No. 5,766,380.

[51] Int. Cl.$^6$ .......................... C22C 21/00; C23C 14/34; C22F 1/04
[52] U.S. Cl. .............................................................. 148/577
[58] Field of Search ............................................. 148/577

[56] References Cited

U.S. PATENT DOCUMENTS

| | | | |
|---|---|---|---|
| 4,159,217 | 6/1979 | Selines et al. | 148/11.5 |
| 5,087,297 | 2/1992 | Pouliquen | 148/2 |
| 5,160,388 | 11/1992 | Legresy et al. | 148/552 |
| 5,268,236 | 12/1993 | Dumont et al. | 428/636 |
| 5,456,815 | 10/1995 | Fukuyo et al. | 204/298 |

OTHER PUBLICATIONS

Kobayashi, Masaru; Hirotsu, Yoshihiko; Ohtani, Yoshiharu; Takahashi, Takeshi; Tatemura, Makoto, Superplasticity improvement and grain refinement in 7475 aluminum alloy by cryogenic working and heat treatment, HCA, AN: 112:40906, Keikinzoku (1989), 39(11), 776–82 (Absract only).

Gindin, I.A. Starodubov, Ya, D.; Matsevity; V.M. Borisova, I.F.j Aksenov, V.K. Defect structure of polycrystalline aluminum after low–temperature rolling and annealing, HCA, AN 79: 117648, FIZ—Metal. Metalloved. (1973), 35(6), 1256–63 (abstract only).

Vandermeer, Ray A., A Transient effect in grain–boundary migration during recrystallization in aluminum, AN :66:89150HCA, Acta Metall (1967), 15(3), 447–58 (abstract only).

C.E. Wickersham, Jr., *Crystallographic Target Effects In Magnetron Sputtering*, J. Vac. Sci. Technol. A5 (4), Jul./Aug. 1987.

*Primary Examiner*—Sikyin Ip
*Attorney, Agent, or Firm*—Wood, Herron & Evans, L.L.P.

[57] ABSTRACT

A method is provided for fabricating aluminum alloy sputtering targets having fine precipitates of a second phase material in small, randomly oriented and uniform grains. The method provided includes the steps of homogenizing the aluminum alloy billet at a temperature above the solidus temperature, deforming the billet, recrystallizing the billet at a temperature below the solidus temperature, and cryogenically deforming the billet. This minimizes second-phase precipitate size and prevents the formation of cubic structures, thereby generating fine uniform grain sizes having random orientation.

24 Claims, 2 Drawing Sheets

METHOD FOR FABRICATING RANDOMLY ORIENTED ALUMINUM ALLOY SPUTTING TARGETS WITH FINE GRAINS AND FINE PRECIPITATES

This is a continuation of U.S. application Ser. No. 08/743,305 filed Nov. 5, 1996, now U.S. Pat. No. 5,766,380.

FIELD OF THE INVENTION

The present invention relates to a method of fabricating aluminum alloy sputtering targets having fine, uniformly sized, and randomly oriented grains, which improve both particle generation in the sputtering process and film uniformity on substrates, such as semiconductor wafers manufactured using such targets.

BACKGROUND OF THE INVENTION

Sputtering refers to a process which involves the coating of a semiconductor wafer or other substrate mounted within a processing chamber, which wafer is biased electrically with respect to a spatially opposed target made with the material to be sputtered. An inert gas is introduced into the chamber at low temperature and an electric field is applied to ionize the gas. Ions from the gas bombard the target and dislodge atoms from the target which are subsequently deposited onto the wafer or other substrate.

Prior methods of fabricating aluminum alloy sputtering targets included the steps of billet homogenization, target formation and final recrystalization. The billet homogenization was typically done at temperatures lower than the solidus temperature in order to inhibit grain growth.

One method of controlling cyrstallographic orientation is disclosed by Pouliquen, U.S. Pat. No. 5,087,297, herein incorporated by reference. Pouliquen discloses slow forging a heated billet to produce a preferred <110> grain orientation. The method of Pouliquen heats a 4 inch by 7 inch billet having a grain size of 1 mm to a temperature of 572° F. The heated billet is then slowly forged from a thickness of 7 inches to a thickness of 1½ inches. The billet is then machined to final dimensions to result in a sputtering target having a 1 mm grain size oriented in the <110>direction, as determined by x-ray diffraction. The method of Pouliquen deforms the billet at a rate of 0.5 inches–4 inches/minute at a temperature of 550° F. to 900° F.

Another manufacturing method is disclosed by Fukuyo, U.S. Pat. No. 5,456,815, herein incorporated by reference. Fukuyo provides for hot working of an Al-3.0 wt. % Cu at 520° C., followed by warm-working at 275° C. in a working ratio of between 1.8 and 2.0, followed by heat treating at a temperature between 420° C. and 470° C. for 1 hour.

The solution treatment raises the temperature of the billet higher than the solidus temperature of the alloy to disburse the second phase precipitates, such as Cu, into the Al matrix. Previously, such solution treatment resulted in significant grain growth caused by the loss of the pinning effect of the precipitates on grain front boundary movement. In order to refine the grains of the solution treated billet, the billets are deformed at room temperature or at temperatures up to 500° C. Typically, the deformation of low alloy aluminum materials results in a cubic structure resulting in a grain orientation with a high percentage of (220) or (200) grain orientation.

The prior processes provide either (200) or (220) oriented structure and/or large second phase precipitates of up to 10 microns. Targets having a strong (200) or (220) orientation generate films having poor uniformity. Poor conductivity of the large second phase precipitates generate localized arcing during sputtering, resulting in a high particle density or in large particles deposited on the wafers.

In order to improve the efficiency of integrated circuit manufacture, lower cost of manufacturing and improve productivity and yield, it is desired to improve the deposited film uniformity and increase the deposition rate. It is known that film uniformity and sputter deposition rate are related to the crystallographic orientation of the sputtering target which affects the distribution of material ejected from the target. It is also known that the sputtering of atoms from the target occurs preferentially along the close packed directions the target material and that a near random grain orientation provides better uniformity of the sputtered films.

SUMMARY OF THE INVENTION

In order to obtain better uniformity in sputtering of thin films, the present invention provides for cryo-deformation prior to recrystalization in order to obtain uniform, fine and randomly oriented grains. The present invention also solution treats the billet to homogenize the material and to minimize second phase precipitate size to inhibit microarcing at the location of the precipitates. The present invention minimizes the second phase precipitate size without increasing the formation of large grains.

The above and other objects and advantages of the present invention shall be made apparent from the accompanying photographs and the description thereof.

The accompanying drawings illustrate embodiments of the invention and together with the general description of the invention given above and the detailed description of the embodiments given below, serve to explain the principles of the invention.

DETAILED DESCRIPTION OF SPECIFIC EMBODIMENTS

Randomly oriented aluminum alloy sputtering targets with fine grains and fine precipitates are formed in accordance with the principles of the present invention. In accordance with the present invention, multiphase Al-0.5 Cu-1.0Si aluminum alloy sputtering targets have been produced. However, it is to be understood that the invention is not limited to Al-0.5Cu-1.0Si targets and is useful for any Al—Si or Al—Cu aluminum alloy, and for cubic crystalline materials, such as Cu, Ni and Au, which require isotropic properties for applications.

High purity alloys for use in physical vapor deposition for sputtering processes are typically continuously cast in billet form having a diameter of 4–8 inches and a length of 5–6 feet. These billets are cut into various lengths depending on the eventual size of the sputtering target, typically 4–8 inches long.

Figure 1A:
FIG. 1A is a scanning electron microscope photomicrograph showing second phase precipitation morphology of the prior art method.
Figure 1B:
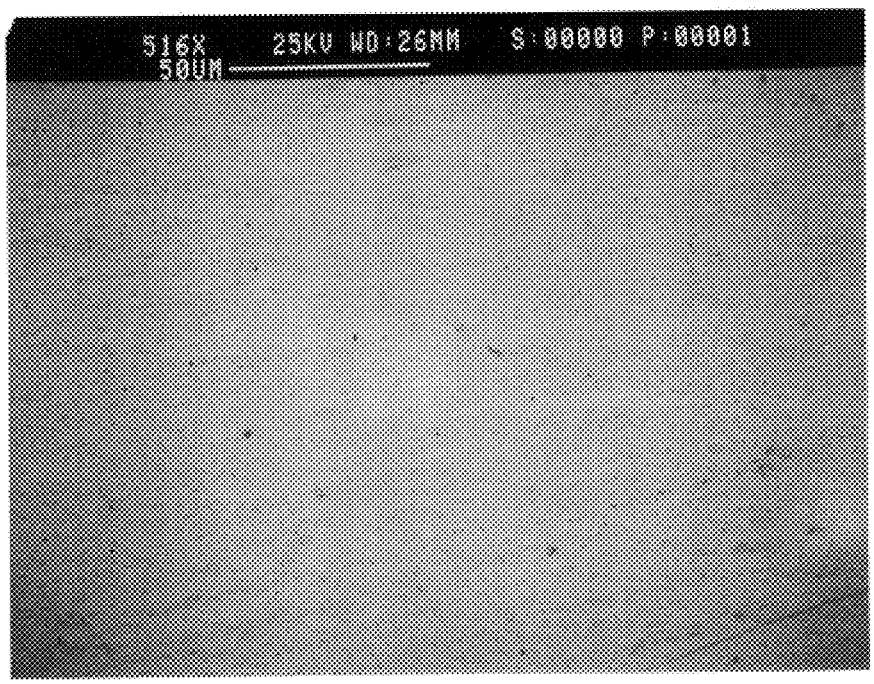
FIG. 1B is a scanning electron microscope photomicrograph showing second phase precipitation morphology of the present invention.
Figure 2A:
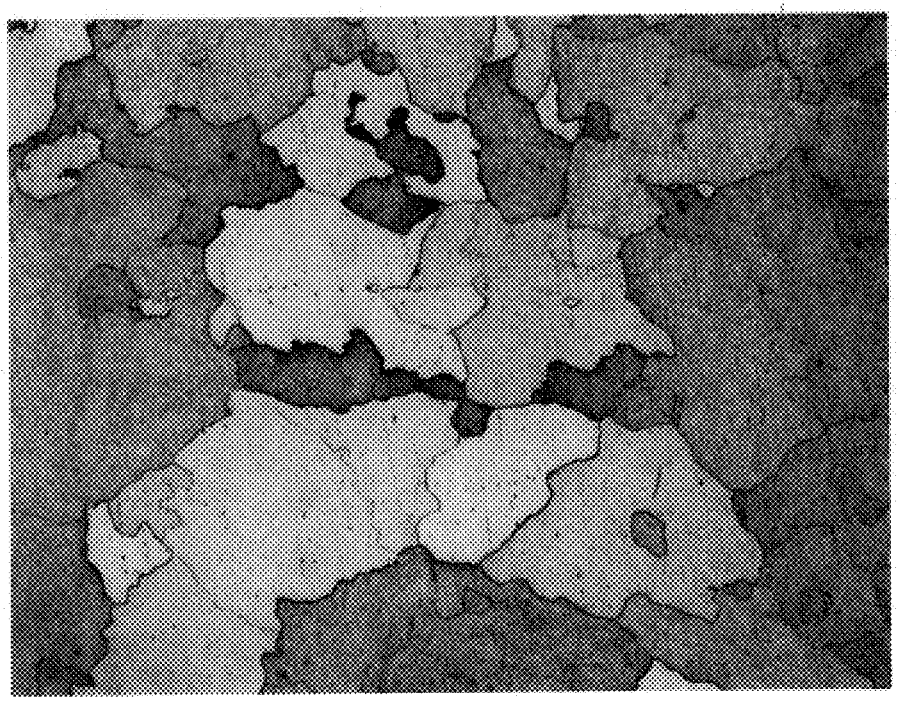
FIG. 2A is an optical microscope photomicrograph at 100× magnification of grain size distribution of the prior art.
Figure 2B:
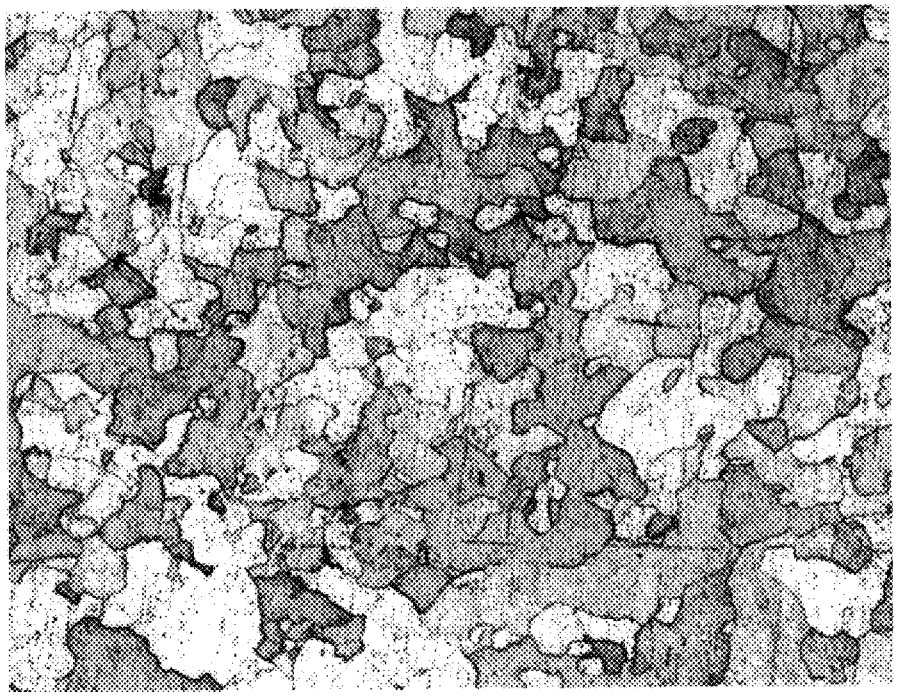
FIG. 2B is an optical microscope photomicrograph at 100× magnification of the grain size and orientation, after recrystalization, of the present invention.

In the present invention, the alloy billet is homogenized at a temperature 10° C. to 100° C. higher than the solidus temperature of the alloy for a time up to 24 hours in an inert atmosphere. As can be seen by comparing FIG. 1A with FIG. 1B the size of the second phase precipitates is substantially reduced. The solidus temperature is defined as the transition temperature at which the second phase is dissolved in the matrix. The homogenization temperature varies depending on the element used for alloying and the alloy content. Al-1Si alloys have a suggested homogenization temperature between 530° C. and 620° C. Al-1Cu alloys have a suggested homogenization temperature between 390° C. and 480° C. Al-0.5Cu-1.0Si alloys have a suggested homogenization temperature between 530° C. and 620° C. Homogenization dissolves the second phase material, such as Cu and/or Si into matrix. The billet is homogenized at a temperature at least 10° C. above the solidus temperature for a period of time sufficient to fully dissolve the second phase material, i.e., up to 24 hours. The homogenized billet is then water quenched.

Following quenching, the homogenized billet is cold worked by pressing, forging or rolling to achieve uniform deformation throughout the billet. The billet is deformed at room temperature in the axial direction and then deformed radially so that the resultant shape is approximately equal to the original shape. A minimum deformation of 60% is suggested both axially and radially. In the deformation process the stresses generate deformed microstructure, and during the subsequent recrystallization of the billet, the deformed microstructure serves as the driving force for the generation of fine, uniform grains. During recrystallization the billet is heated to a temperature below the solidus temperature to avoid the formation of second phase precipitates. The billet is heated to a temperature of at least 220° C., the minimun suggested recrystallization temperature for Al. An Al-1Si or an Al-0.5Cu-1Si billet is to be heated to a temperature 100° C. to 200° C. below the solidus temperature, and an Al-1Cu billet is to be heated to a temperature of 100° C. to 180° C. below the solidus temperature for 3–6 hours to result in a fine substantially uniform grains.

The billet is then cryo-deformed to near the final shape of the target. The cryo-deformation process prevents the generation of cubic texture structures during deformation by inhibiting the movement of dislocations which reduces the activation of slip systems and results in the formation of shear bands. In a preferred method, the billet is cooled in a cryogenic medium, such as liquid nitrogen (b.p.=−195° C.) or liquid helium (b.p.=−268° C.) for a period sufficient to cool the entire billet to a temperature approaching that of the cryogenic medium. The cooled billet is then alternately worked both vertically and horizontally, by rolling, forging or pressing, and briefly cooled in the cryo-medium between each working to maintain the very low working temperature.

The cryo-deformed billet is then recrystallized a second time in order to relieve the stresses generated by the cryo-deformation process. During recrystallization the billet is heated to a temperature below the solidus temperature to avoid the formation of second phase precipitates. Again, a billet heated to a temperature 100° C. to 200° C. below the solidus temperature for Al-1Si and Al-0.5Cu-1Si alloys, and a temperature of 100° C. to 180° C. below the solidus temperature for Al-1Cu alloy, for 3–6 hours will result in a fine, substantially uniform randomly oriented grains. The billet is then machined to the desired final shape of the sputtering target.

The following is an example of the method of manufacturing a sputtering target. Although the example demonstrates the method for making a Al-0.5Cu-1.0Si target, the invention is not limited to such Al-0.5Cu-1.0Si targets and is useful for any Al—Si or Al—Cu aluminum alloys, and is also useful for cubic crystalline materials, such as Cu, Ni and Au, which require isotropic properties for applications.

EXAMPLE 1

An Al-0.5Cu-1.0Si aluminum alloy billet having a diameter of 7 inches and a length of 4 inches is homogenized by heating to a temperature of 550° C. for 24 hours in an inert atmosphere and then water quenched. The homogenized billet is then worked at room temperature by forging to 4.45 inches in diameter and 10 inches in length then reworked to 7 inches in diameter and 4 inches in length. The worked billet is then recrystallized at 350° C. for 4 hours and then water quenched. The billet is then cryo-pressed by cooling in liquid nitrogen for 30 minutes and pressing to a diameter of 7.8 inches and a length of 3.2 inches. The billet is cooled again in liquid nitrogen for 3 minutes and pressed to a diameter of 8.8 inches and a length of 2.5 inches. The billet is then cooled once again in liquid nitrogen for 3 minutes and pressed to a diameter of 10.5 inches and a length of 1.9 inches. The cryo-pressed billet is then recrystallized at 350° C. for 4 hours followed by water quenching. The billet is then machined to the final shape required for the sputtering target having the grain orientation shown in table 1.

TABLE 1

| | Grain Orientation by Percent | | | |
|---|---|---|---|---|
| | (111) | (200) | (220) | (311) |
| Prior Art | 4 | 70 | 7 | 19 |
| Present Invention | 8 | 32 | 35 | 24 |

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept.

What is claimed is:

1. A method of fabricating randomly oriented alloy sputtering targets with fine grains and fine precipitates comprising the steps of:
   homogenizing an alloy billet at a temperature above the solidus temperature of the alloy;
   deforming the homogenized billet both vertically and horizontally;
   recrystallizing the billet at a temperature below the solidus temperature; and
   cryogenically deforming the recrystallized billet both vertically and horizontally.

2. The method of claim 1, wherein the step of cryogenically deforming the recrystallized billet is done at a temperature below 0° C.

3. The method of claim 1, wherein the step of cryogenically deforming the recrystallized billet is done at a temperature approaching the boiling point of liquid nitrogen.

4. The method of claim 1, wherein the step of cryogenically deforming the recrystallized billet is done at a temperature approaching the boiling point of liquid helium.

5. The method of claim 1, wherein the homogenization step is performed at a temperature between about 10° C. and 100° C. above the solidus temperature of the alloy.

6. The method of claim 5, wherein the alloy is Al-0.5Cu-1Si and the homogenization step is performed at a temperature between about 530° C. and 620° C.

7. The method of claim 5, wherein the alloy is Al-1Si and the homogenization step is performed at a temperature between about 530° C. and 620° C.

8. The method of claim 5, wherein the alloy is Al-1Cu and the homogenization step is performed at a temperature between about 390° C. and 480° C.

9. The method of claim 5, wherein the alloy is predominantly a cubic lattice material selected from the group consisting of Cu, Ni and Au.

10. The method of claim 1, wherein the recrystallization step is performed at a temperature between about 100° C. and 200° C. below the solidus temperature of the alloy.

11. The method of claim 10, wherein the alloy is Al-0.5Cu-1Si and the recrystallization step is performed at a temperature between about 320° C. and 420° C.

12. The method of claim 10, wherein the alloy is Al-1Si and the recrystallization step is performed at a temperature between about 320° C. and 420° C.

13. The method of claim 10, wherein the alloy is Al-1Cu and the recrystallization step is performed at a billet temperature between about 220° C. and 280° C.

14. The method of claim 1 further comprising the step of:
    machining the deformed, recrystalized billet to final shape.

15. The method of claim 1 wherein said cryogenic deformation step is performed by at least one method selected from the group consisting of pressing, rolling and forging.

16. A method of cryo-deforming aluminum alloy billets to achieve random grain orientation, comprising the steps of:
    cooling an alloy billet in a cryo-medium;
    deforming the billet both vertically and horizontally while cooled;
    quenching the deformed billet for a time sufficient to cool the billet to about the temperature of the cryo-medium; and
    deforming the quenched billet both vertically and horizontally.

17. The method of claim 16 wherein said cryo-medium is a liquified gas.

18. The method of claim 16 wherein said cryo-medium is liquified nitrogen.

19. The method of claim 16 wherein said cryo-medium is liquified helium.

20. The method of claim 16 wherein the deformation steps are performed by at least one method selected from the group of rolling, pressing and forging.

21. The method of claim 16, wherein the quenching step is performed for greater than about 2 minutes.

22. The method of claim 16, wherein said cooling step is performed for a time sufficient to cool the billet to about the temperature of the cryo-medium.

23. The method of claim 22, wherein the cooling step is performed for greater than about 15 minutes.

24. The method of claim 22, wherein the cooling step is performed for greater than about 30 minutes.

* * * * *